(12) United States Patent
Bae et al.

(10) Patent No.: US 8,431,329 B2
(45) Date of Patent: *Apr. 30, 2013

(54) SELF-ALIGNED SPACER MULTIPLE PATTERNING METHODS

(75) Inventors: Young Cheol Bae, Weston, MA (US); Thomas Cardolaccia, Needham, MA (US); Yi Liu, Wayland, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 282 days.

This patent is subject to a terminal disclaimer.

(21) Appl. No.: 12/825,117

(22) Filed: Jun. 28, 2010

(65) Prior Publication Data

US 2010/0330498 A1 Dec. 30, 2010

Related U.S. Application Data

(60) Provisional application No. 61/269,600, filed on Jun. 26, 2009, provisional application No. 61/281,553, filed on Nov. 19, 2009, provisional application No. 61/281,681, filed on Nov. 19, 2009.

(51) Int. Cl.
- *G03F 7/00* (2006.01)
- *G03F 7/004* (2006.01)
- *G03F 7/028* (2006.01)
- *G03F 7/40* (2006.01)

(52) U.S. Cl.
USPC ............. 430/312; 430/270.1; 430/271.1; 430/273.1; 430/330; 430/322; 430/331; 430/913

(58) Field of Classification Search ........... 430/270.1, 430/271.1, 273.1, 913, 322, 312, 330, 331
See application file for complete search history.

(56) References Cited

U.S. PATENT DOCUMENTS

| 6,534,243 B1 | 3/2003 | Templeton et al. |
| 8,173,358 B2 * | 5/2012 | Kim et al. ............. 430/312 |
| 2006/0127816 A1 * | 6/2006 | Kang et al. ........... 430/312 |
| 2008/0166665 A1 * | 7/2008 | Jung ..................... 430/313 |
| 2008/0199814 A1 | 8/2008 | Brzozowy et al. |
| 2009/0032963 A1 | 2/2009 | Tran |
| 2009/0087786 A1 * | 4/2009 | Hatakeyama ........ 430/285.1 |
| 2009/0146322 A1 | 6/2009 | Weiling et al. |
| 2009/0155715 A1 | 6/2009 | Chen et al. |
| 2009/0239382 A1 | 9/2009 | Zhu |
| 2009/0253080 A1 * | 10/2009 | Dammel et al. ........ 430/324 |
| 2010/0190104 A1 * | 7/2010 | Nakamura et al. ..... 430/270.1 |
| 2010/0330471 A1 | 12/2010 | Bae et al. |

(Continued)

FOREIGN PATENT DOCUMENTS

| EP | 1 975 718 | 10/2008 |
| WO | WO 2008/143301 | 11/2008 |
| WO | WO 2009/009095 | 1/2009 |
| WO | WO 2009/091665 | 7/2009 |

OTHER PUBLICATIONS

European Search Report of corresponding European Application No. 10 16 7364.

*Primary Examiner* — Amanda C. Walke
(74) *Attorney, Agent, or Firm* — Jonathan D. Baskin

(57) ABSTRACT

Self-aligned spacer multiple patterning method are provided. The methods involve alkaline treatment of photoresist patterns and allow for the formation of high density resist patterns. The methods find particular applicability in semiconductor device manufacture.

15 Claims, 3 Drawing Sheets

U.S. PATENT DOCUMENTS

Figure 1:
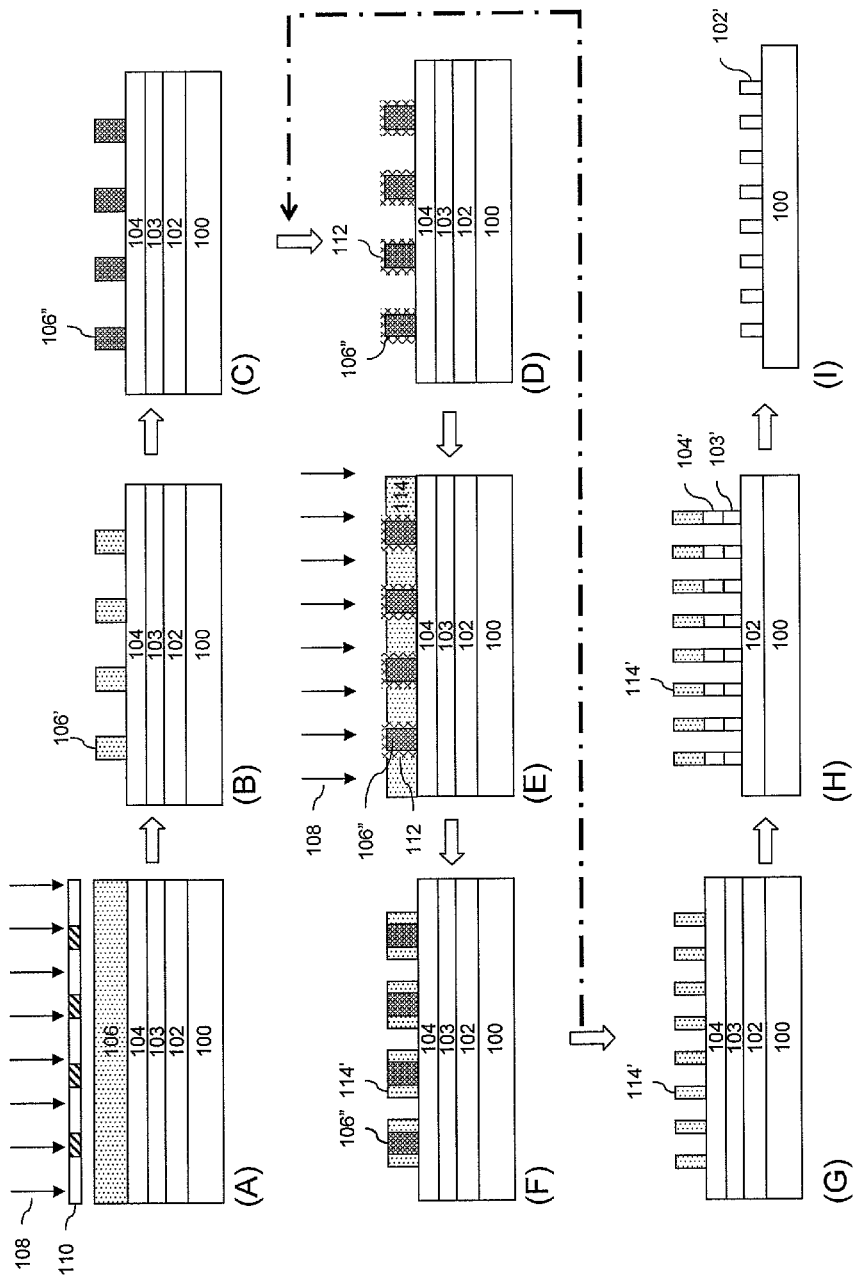

2010/0330498 A1 12/2010 Bae et al.
2010/0330499 A1 12/2010 Bae et al.
2010/0330500 A1 12/2010 Bae et al.
2010/0330501 A1 12/2010 Bae et al.
2010/0330503 A1 12/2010 Bae et al.
2011/0117490 A1 5/2011 Bae et al.

* cited by examiner

SELF-ALIGNED SPACER MULTIPLE PATTERNING METHODS

This application claims the benefit of priority under 35 U.S.C. §119(e) to U.S. Provisional Application Nos. 61/269,600, filed Jun. 26, 2009 and 61/281,553, filed Nov. 19, 2009 and 61/281,681 filed Nov. 19, 2009, the entire contents of which applications are incorporated herein by reference.

This invention relates generally to the manufacture of electronic devices. More specifically, this invention relates to methods of forming electronic devices using self-aligned spacer lithographic techniques. The invention finds particular use in the manufacture of semiconductor devices for forming high-density lithographic patterns and features. Double or higher order patterning can be performed in accordance with the invention.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

The theoretical resolution limit as defined by the Rayleigh equation is shown below:

$$R = k_1 \frac{\lambda}{NA}$$

where $k_1$ is the process factor, $\lambda$ is the wavelength of the imaging tool and NA is the numerical aperture of the imaging lens. When using water as the immersion fluid, the maximum numerical aperture can be increased, for example, from 1.2 to 1.35. For a $k_1$ of 0.25 in the case of printing line and space patterns, 193 nm immersion scanners would only be capable of resolving 36 nm half-pitch line and space patterns. The resolution for printing contact holes or arbitrary 2D patterns is further limited due to the low aerial image contrast with a dark field mask wherein the theoretical limit for $k_1$ is 0.35. The smallest half-pitch of contact holes is thus limited to about 50 nm. The standard immersion lithography process is generally not suitable for manufacture of devices requiring greater resolution.

In an effort to achieve greater resolution and to extend capabilities of existing manufacturing tools, various double patterning techniques have been proposed. One such technique is self-aligned double patterning (SADP). In this process, a spacer layer is formed over pre-patterned lines. This is followed by etching to remove all spacer layer material on horizontal surfaces of the lines and spaces, leaving behind only material on the sidewalls of the lines. The original patterned lines are then etched away, leaving behind the sidewall spacers which are used as a mask for etching one or more underlying layers. Since there are two spacers for every line, the line density is effectively doubled. The spacer approach is unique as compared with the previously described techniques in that only one lithographic exposure is required. As a result, issues associated with overlay between successive exposures can be avoided.

U.S. Patent Application Pub. No. 2009/0146322A1 discloses a self-aligned spacer double patterning method in which the sacrificial first pattern can comprise polysilicon, while the spacer layer can comprise silicon nitride, silicon oxide or silicon oxynitride. That document further discloses that such materials are coated by deposition processes, such as physical vapor deposition, chemical vapor deposition, electrochemical deposition, molecular beam epitaxy or atomic layer deposition. These deposition processes, however, require repeated etch steps which may not be cost effective. For example, when silicon oxynitride is deposited as a sidewall spacer material, the process can involve numerous steps such as resist trim etch, pattern transfer etch to amorphous carbon layer, cleaning, deposition of nitride over the amorphous carbon template, etch to open the nitride top, ash of amorphous carbon core, pattern transfer etch to silicon oxide and silicon oxide trim etch. It would therefore be desirable to employ a self-aligned spacer approach which avoids the use of deposition processes for pattern formation and coating of the spacer layer.

There is a continuing need in the art for multiple patterning processes which address one or more of the foregoing problems associated with the state of the art.

In accordance with a first aspect of the invention, self-aligned spacer multiple patterning methods are provided. The methods comprise: (a) providing a semiconductor substrate comprising one or more layers to be patterned; (b) applying a first layer of a first photosensitive composition over the one or more layers to be patterned, wherein the first photosensitive composition comprises a first resin component and a first photoactive component; (c) exposing the first layer to activating radiation through a patterned photomask; (d) developing the exposed first layer to form a resist pattern; (e) heat treating the resist pattern in a hardbake process; (f) treating the hard-baked resist pattern with a material effective to make alkaline a surface of the resist pattern; (g) applying a second layer of a second photosensitive composition over the one or more layers to be patterned and in contact with the alkaline surface of the resist pattern, the second photosensitive composition comprising a second resin component and a photoacid generator; (h) exposing the second layer to activating radiation; and (i) developing the exposed second layer to form spacers over the one or more layers to be patterned, the spacers comprising portions of the second layer not removed during the second layer development.

The present invention will be discussed with reference to the following drawings, in which like reference numerals denote like features, and in which:

FIG. 1A-I illustrates in cross-section a first exemplary process flow for a self-aligned spacer multiple patterning method in accordance with the invention;

FIG. 2A-J illustrates in cross-section a second exemplary process flow for a self-aligned spacer multiple patterning method in accordance with the invention; and FIG. 3A-H illustrates a top-down view of a third exemplary process flow for a self-aligned spacer multiple patterning method in accordance with the invention.

The invention will now be described with reference to FIG. 1A-I, which illustrates in cross-section a first exemplary process flow for a self-aligned spacer double patterning method in accordance with the invention.

FIG. 1A depicts a substrate 100 which may include various layers and features formed on a surface thereof. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example: chemical vapor deposition (CVD) such as plasma-enhanced CVD, low-pressure CVD or epitaxial growth; physical vapor deposition (PVD) such as sputtering or evaporation; or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 103 can include a single layer or a plurality of layers of different materials. The hard mask layer can be formed, for example, by chemical or physical vapor deposition techniques.

A bottom antireflective coating 104 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm), ArF excimer laser light (193 nm), electron beams and soft x-rays. The antireflective coating 104 can comprise a single layer or a plurality of different layers. Suitable antireflective materials and methods of formation are known in the art. Antireflective materials are commercially available, for example, those sold under the AR trademark by Rohm and Haas Electronic Materials LLC (Marlborough, Mass. USA), such as AR™40A and AR™124 antireflectants.

A first photosensitive composition is applied on the substrate over the antireflective layer 104 (if present) to form a first photosensitive layer 106. The first photosensitive composition comprises a resin component and a photoactive component. As used herein, the terms "photosensitive material(s)", "photosensitive composition(s)" and "photoresist(s)" are used interchangeably. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. The photoresist materials useful in the methods of the invention for forming a first resist pattern include both positive- and negative-acting materials.

Suitable positive-acting materials include positive-acting chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

Suitable negative-acting resists typically will contain a crosslinking component. The crosslinking component is typically present as a separate resist component. Amine-based crosslinkers such as a melamine, for example, the Cymel melamine resins, are typical. Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof are disclosed in European Patent Nos. EP0164248B1 and EP0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125. For imaging at sub-200 nm wavelengths such as 193 nm, typical negative-acting photoresists are disclosed in International Application Pub. No. WO 03077029.

The resin of the first photosensitive composition preferably has functional groups that impart alkaline aqueous developability to the resist composition. For example, typical are resin binders that comprise polar functional groups such as hydroxyl or carboxylate. The resin component is used in the composition in an amount sufficient to render exposed regions in the case of a positive-acting material, or unexposed regions in the case of a negative-acting material, of the composition developable in a developer solution, such as an aqueous alkaline solution. The resin component will typically comprise about 70 to about 97 wt % of total solids of the resist.

The photosensitive composition further comprises a photoactive component employed in an amount sufficient to generate a latent image in a coating layer of the composition upon exposure to activating radiation. For example, the photoactive component will suitably be present in an amount of from about 1 to 20 wt % of total solids of the resist. Typical photoactive components in the resist compositions are one or more photoacid generator. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

The photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EUV and 157 nm. In an exemplary aspect, the photoresists are suitable for use with and imaged at a sub-200 nm wavelength such as 193 nm. At such wavelengths, the use of immersion lithography is typical although dry processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photosensitive composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the first photosensitive layer 106 is from about 500 to 1500 Å. The first photosensitive layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photosensitive layer and thickness. Typical softbakes are conducted at a temperature of from about 90 to 150° C., and a time of from about 30 to 90 seconds.

If the first photosensitive layer 106 is to be exposed with an immersion lithography tool, for example a 193 nm immersion scanner, a topcoat layer (not shown) can be disposed over the photosensitive layer 106. Use of such a topcoat layer can act as a barrier between the immersion fluid and underlying photosensitive layer. In this way, leaching of components of the photosensitive composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and are otherwise known in the art, for example, those described in U.S. Patent Application Pub. No. 2006/0246373A1 and in U.S. Provisional Application Nos. 61/204,007, filed Dec. 31, 2008. Such compositions can be applied over the photosensitive layer by any suitable method such as described above with reference to the photosensitive compositions, with spin coating being typical. The topcoat layer thickness is typically $\lambda/4n$ (or an odd multiple thereof), wherein $\lambda$ is the wavelength of the exposure radiation and n is the refractive index of the topcoat layer. If a topcoat layer is present, the first photosensitive layer 106 can be softbaked after the topcoat layer composition has been applied rather than prior to topcoat application. In this way, the solvent from both layers can be removed in a single thermal treatment step.

The first photosensitive layer 106 is next exposed to activating radiation 108 through a first photomask 110 to create a difference in solubility between exposed and unexposed regions. For a positive-acting material, as illustrated, the photomask has optically transparent and optically opaque regions, the optically transparent regions corresponding to regions of the photosensitive layer to be removed in a subsequent development step. For negative-acting materials, the optically opaque regions would correspond with portions of the resist layer to be developed away. The exposure energy is typically from about 1 to 100 mJ/cm$^2$, dependent upon the exposure tool and the components of the photosensitive composition. References herein to exposing a photosensitive composition to radiation that is activating for the composition indicates that the radiation is capable of forming a latent image in the photosensitive composition such as by causing a reaction of the photoactive component, for example, by producing photoacid from a photoacid generator compound. The photosensitive compositions are typically photoactivated by a short exposure wavelength, particularly a sub-400 nm, sub- 300 or sub-200 nm exposure wavelength, with I-line (365 nm), 248 nm and 193 nm being typical exposure wavelengths, as well as EUV and 157 nm.

Following exposure of the first photosensitive layer 106, a post-exposure bake (PEB) of the photosensitive layer is typically performed at a temperature above the softening point of the layer. The PEB can be conducted, for example, on a hotplate or in an oven. Conditions for the PEB will depend, for example, on the particular material of the photosensitive layer and thickness. The PEB is typically conducted at a temperature of from about 80 to 150° C., and a time of from about 30 to 90 seconds.

The exposed photosensitive layer 106 is next developed to form a first resist pattern 106' as shown in FIG. 1B. While the developer material will depend on the particular material of the photosensitive layer 106, suitable developers and development techniques are known in the art. Typical developers include, for example, aqueous base developers such as quaternary ammonium hydroxide solutions, for example, tetra-alkyl ammonium hydroxide solutions such as 0.26 N tetramethylammonium hydroxide.

Following development, the first resist pattern 106' is heat-treated in a first hardbake process to dry the pattern and form a hardened resist pattern 106", as shown in FIG. 1C. This heat-treatment is believed to facilitate adsorption of the subsequently applied surface treatment chemistry to the resist pattern. The hardbake is typically conducted with a hot plate or oven, and is typically conducted at a temperature of about 150° C. or higher, for example, from about 170 to 180° C., and a time of from about 30 to 120 seconds.

With reference to FIG. 1D, the hardbaked first resist pattern 106" is treated with a material effective to make alkaline a surface of the resist pattern. The alkaline surface interferes with reaction during exposure of a subsequently applied photosensitive layer over the resist pattern. For example, in the case of a positive-acting photosensitive layer, acid-catalyzed deprotection reaction is prevented in regions in the immediate vicinity of the underlying alkaline-treated resist pattern. As a consequence, portions of the photosensitive layer would remain in those regions after development.

While not limited thereto, particularly suitable materials comprise an alkaline material and a surfactant which is different from the alkaline material. It is believed that the surfactant promotes formation of a substantially uniform coating layer of the second resist over the alkaline material treated resist pattern.

The alkaline material can take various forms, and may be in the form of a solution formed by dissolving a solid compound in a suitable solvent. Suitable alkaline materials for the resist pattern treatment include, for example, aqueous base developers such as quaternary ammonium hydroxide solutions, for example, tetra-alkyl ammonium hydroxide solutions such as 0.26 Normality (N) (2.38 wt %) tetramethylammonium hydroxide (TMAH). Solvent materials used for the alkaline material and otherwise in the compositions should not dissolve or minimize dissolution of the underlying photoresist The alkaline material (absent any solvent, e.g., water, alcohol or the like) is typically present in the compositions in an amount of from about 1 to 10 wt %, based on the total composition.

Suitable surfactants for the resist pattern treatment compositions include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

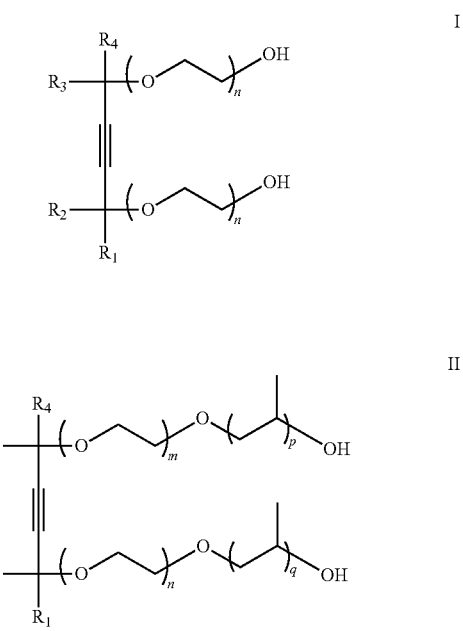

wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Particularly suitable surfactants include amines, typically primary and secondary amines, i.e., an amine including one or more primary amine groups and one or more secondary amine groups, respectively, and combinations thereof. Tertiary amine groups can be present in addition to the primary and/or secondary amine groups. Typically, the amine is a multifunctional amine. The amine can be a polyamine, such as a diamine, triamine or tetra-amine. Suitable primary amines include compounds of the following formula (I):

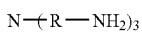 (I)

wherein R is chosen from optionally substituted alkyl such as optionally substituted C1 to C6 alkyl, such as methyl, ethyl or propyl, with ethyl being typical. Other suitable primary amines include poly(allyl amines) represented by the following formula (II):

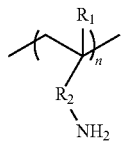 (II)

wherein: $R_1$ is chosen from hydrogen and optionally substituted alkyl such as C1 to C3 alkyl; $R_2$ is chosen from optionally substituted alkylene such as C1 to C6 alkylene, typically methylene or ethylene; and n is an integer greater than or equal to 3. In an exemplary primary amine of the formula (N-II), $R_1$ is hydrogen and $R_2$ is methylene. Other suitable amines include those represented by the following general formulae (III), (IV) and (V):

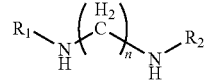 (III)

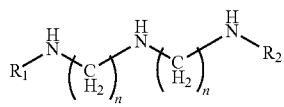 (IV)

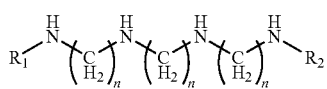 (V)

wherein $R_1$ and $R_2$ are each independently a hydrogen atom or an alkyl group with 1 to 10 carbon atoms, and n is an integer from 1 to 10. Other suitable amines include the following:

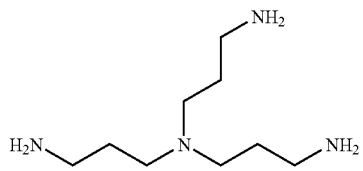 A-1

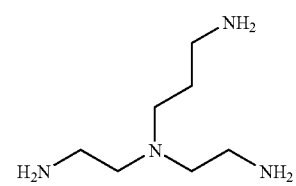 A-2

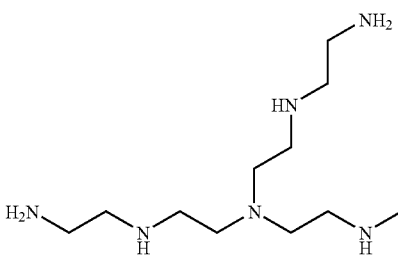 A-3

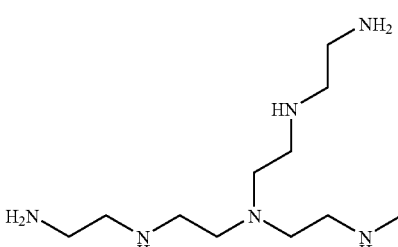 A-4

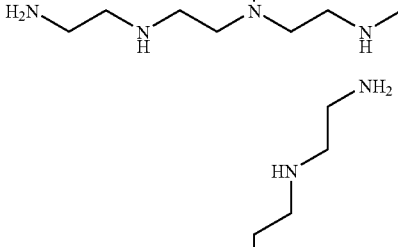 A-5

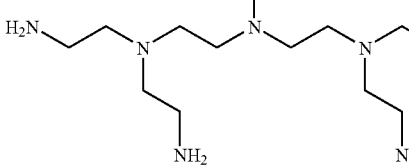 A-6

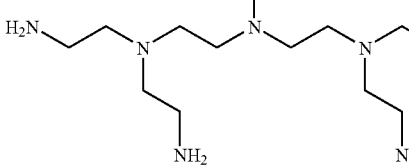 A-7

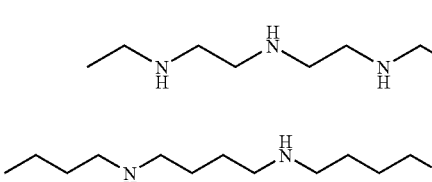 A-8

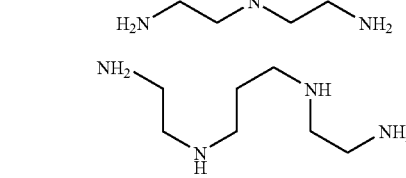 A-9

Of these, tris(2-aminoethyl)amine (TAEA) is particularly preferred.

The surfactant is typically present in the compositions in a relatively small amount, for example, from 0.01 to 5 wt %, for example, from 0.01 to 1 wt %, based on the weight of total solids in the composition (total solids being all compositions components except solvent carrier).

The resist pattern treatment compositions can comprise one or more optional components in addition to the alkaline material and surfactant components. For example, the compositions can include one or more solvent in addition to any solvent used for the alkaline material and surfactant. As described above, solvent materials used for the alkaline material and otherwise in the compositions should not dissolve or minimize dissolution of the underlying photoresist. Suitable solvents will therefore depend on the particular underlying resist material and may include, for example, water and alcohols such as n-butanol. The optional components also include one or more base generator compound, such as a thermal base generator compound and/or a photobase generator compound.

The photoresist pattern treatment compositions can be prepared by admixture in any order of the alkaline material and surfactant components, and any additional components such as solvent and base generator compounds. One or more of the components can be added as a solid or as a pre-mixed solution using a suitable solvent.

Preferably, the alkaline treatment includes treatment with a quaternary ammonium hydroxide and an amine. The quaternary ammonium hydroxide material and amine can be simultaneously applied to the substrate, for example, either from a premixed composition or by applying the materials simultaneously but separate from one another in which case the composition is formed in situ. Preferably, the quaternary ammonium hydroxide material and amine are sequentially applied in that order. The quaternary ammonium hydroxide and amine materials can be applied as a liquid, gas or vapor, and can be applied, for example, by spin-coating, dipping, vapor-coating, chemical vapor deposition (CVD) or other conventional coating technique. Of these, spin-coating of liquid materials is typical. Typically, the quaternary ammonium hydroxide and amine materials can be applied as aqueous solution(s). Where the quaternary ammonium hydroxide and amine are applied simultaneously, the surface treated substrate can be rinsed, for example, with deionized water. Where the quaternary ammonium hydroxide and amine materials are sequentially applied, the amine can be applied as an aqueous solution, functioning also as a water rinse. The surface treated substrate can optionally be rinsed, for example, with deionized water to remove excess composition.

A critical dimension (CD) of the first resist pattern 106" becomes slightly reduced as a result of the surface treatment as compared with the original CD of resist pattern 106'. This CD loss is believed to be attributed to further development of the first resist pattern during the surface treatment. The surface treatment forms a modified first resist pattern surface 112 which is alkaline and which has a line width roughness less than that of the pre-treated surface.

A second photosensitive composition as described above is coated over the first resist pattern 106" and BARC layer 104 to form a second photosensitive layer 114, as shown in FIG. 1E. The alkaline surface on the resist pattern is believed to interfere with photoreaction during exposure in a subsequently applied photoresist layer over the resist pattern. For example, in the case of a positive-acting second photosensitive layer, a deprotection reaction is prevented in that layer in regions in the immediate vicinity of the underlying alkaline-treated resist pattern. As a consequence, a certain amount of the second photosensitive layer would remain in those regions after development.

Except as otherwise stated, the second photosensitive composition can be applied and processed in the same manner including the materials and conditions described above with respect to the first photosensitive layer. While the first photosensitive layer 106 can be positive- or negative-acting, the second photosensitive layer 114 is typically positive-acting. In the illustrated process flow, both the first and second photosensitive compositions are positive acting. In such a case, different materials for the first and second photosensitive layers can be employed such that the first resist pattern 106" is not removed during processing of the second photosensitive layer 114. For example, a first photosensitive layer may be chosen which has a characteristic post-exposure bake temperature that is higher than that of the second photosensitive layer. In this way, the exposed regions of the second photosensitive layer can be selectively removed without also removing exposed regions of the first resist. It may, however, be desired to remove the first resist pattern 106" at the same time the second photosensitive layer 114 is developed. In this case, the same or similar material can be used for the first and second photosensitive layers, or the second photosensitive composition can be selected to have a higher characteristic post-exposure bake temperature than that of the first photosensitive composition. The process flow in the case of simultaneous development of the first resist pattern 106" and second photosensitive layer 114 would skip from that shown in FIG. 1E to 1G.

The second photosensitive layer 114 is typically coated to a thickness less than that of the surface-treated first resist pattern 106" to facilitate removal of the first resist pattern 106" in a subsequent step as described below. Also for purposes of removing the first resist pattern 106", the etchant to be used should have good selectivity to the first photosensitive pattern relative to the second photosensitive composition. As such, the first and second photosensitive compositions should be different. It may, for example, be desired to use a silicon-based polymer, such as a silsesquioxane-type polymer, for the first or second photosensitive composition, while using a photosensitive composition of a different chemistry, such as a composition which is free of silicon resins, for example, an acrylate-, novolak- or phenolic-type photoresist, for the other of the first or second photosensitive composition.

The second photosensitive layer 114 can next be softbaked. If the second photosensitive layer 114 is to be exposed with an immersion lithography tool, a topcoat layer (not shown) as described above can be disposed over the second photosensitive layer 114. If a topcoat layer is used, the second photosensitive layer 114 can be softbaked after the topcoat layer composition has been applied rather than prior to its application.

With reference to FIG. 1(E), the second photosensitive layer 114 is exposed to activating radiation 108, typically by flood-exposure, i.e., without use of a patterned photomask. The exposed second photosensitive layer is heat-treated in a post-exposure bake and developed. The alkaline-modified surface region 112 of the first resist pattern 106" prevents photoreaction in the second resist layer 114 in the vicinity of the surface region. As a result, unreacted portions of the second photosensitive composition remain as spacers 114' on sidewalls of the first resist pattern 106", as illustrated in FIG. 1F. At this point, if desired to adjust the width of the spacers, for example to increase the width, a series of steps in the process can be repeated one or more times beginning with the first hardbake through development of an additional photosensitive layer of the second photosensitive composition, as indicated by the dashed arrow in FIG. 1.

The first photoresist pattern 106" is next removed, leaving behind spacers 114', as shown in FIG. 1G. Because the spacers are typically formed on all side surfaces of the first resist pattern with the resist pattern at the center, they generally result in a closed-ring structure. Therefore, in the case of fabricating a line pattern using the spacer, a trimming process may be performed to remove ends of the patterns to separate the spacer into a discrete line pattern. The trimming process can be conducted, for example, using known etching techniques.

The BARC layer 104 is selectively etched using the spacers 114' as an etch mask, exposing the underlying hardmask layer 103. The hardmask layer is next selectively etched, again using the spacers 114' as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The spacers 114' and patterned BARC layer 104' are next removed from the substrate using known techniques, for example, oxygen plasma ashing.

Using the hardmask pattern 103' as an etch mask, the one or more layers 102 are selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting double patterned structure is a pattern of etched features 102' as illustrated in FIG. 1I. In an alternative exemplary method, it may be desirable to pattern the layer 102 directly using the spacers 114' without the use of a hardmask layer 103. Whether direct patterning with the spacers can be employed will depend on factors such as the materials involved, resist selectivity, resist pattern thickness and pattern dimensions.

Figure 2:
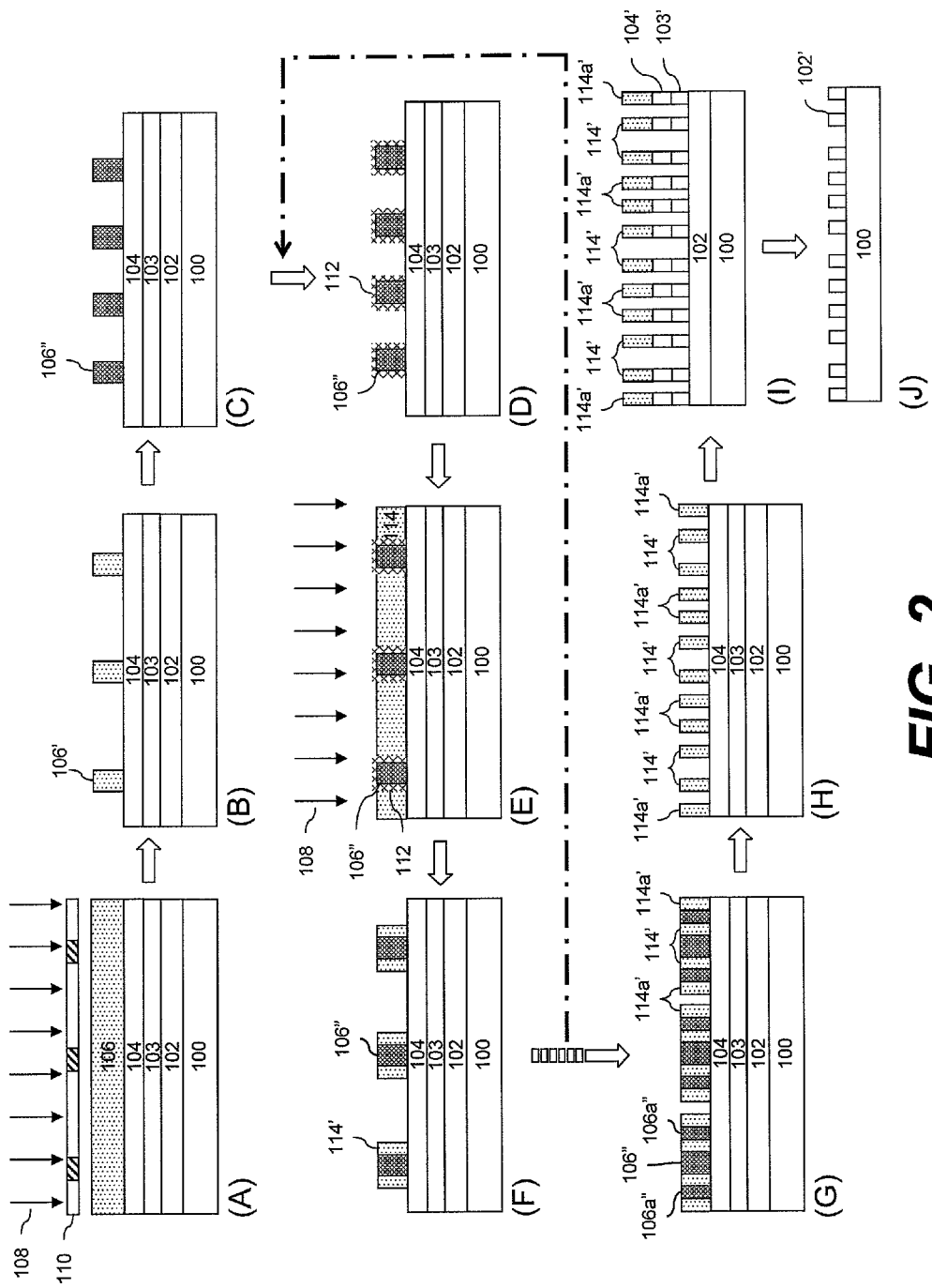

FIG. 2 illustrates in cross-section a further exemplary process flow for a self-aligned spacer multiple patterning method in accordance with the invention. This process flow is a variation of the double patterning technique described with reference to FIG. 1, in which one or more additional spacer 114a' is formed on each original spacer 114' to allow a further decreased line pitch. Except as otherwise stated, the description above with respect to FIG. 1 is also applicable to the process flow of FIG. 2.

The process with respect to FIG. 2A-F is carried out in the manner described above with reference to FIG. 1A-F. After formation of spacers 114' as shown in FIG. 2F, the sequence of steps beginning with the first hardbake through development is repeated except that the next (third) photosensitive layer is of a composition having the same or similar etch selectivity as the first photosensitive layer 106, as the first resist pattern and pattern 106"a formed from the third photosensitive layer are to be removed at the same time. The third photosensitive layer should additionally be positive-acting. After development of the exposed third photosensitive layer, second spacers 106a' remain on exposed sides of the originally formed spacers 114'. The same sequence of steps is again repeated, this time forming a fourth positive-acting photosensitive layer of a composition having the same or similar etch selectivity as the second photosensitive layer 114. The resulting structure after development, shown in FIG. 2G, includes third spacers 114a' formed on exposed sides of second spacers 106a'. This spacer formation process can optionally be repeated one or more additional times, alternating between photosensitive layer chemistries of the first and second types to create additional spacers of the two types in a sandwich structure. The photoresist patterns 106", 106a" from the first photosensitive composition type are next removed, leaving behind the spacers 114', 114a', as shown in FIG. 2H. In the same manner described above with reference to FIG. 1, the spacers 114', 114a' are used as an etching mask to pattern one or more underlying layers directly or to first pattern an underlying hardmask layer which is then used to pattern the underlying layers, as illustrated in FIG. 2I-J.

Figure 3:
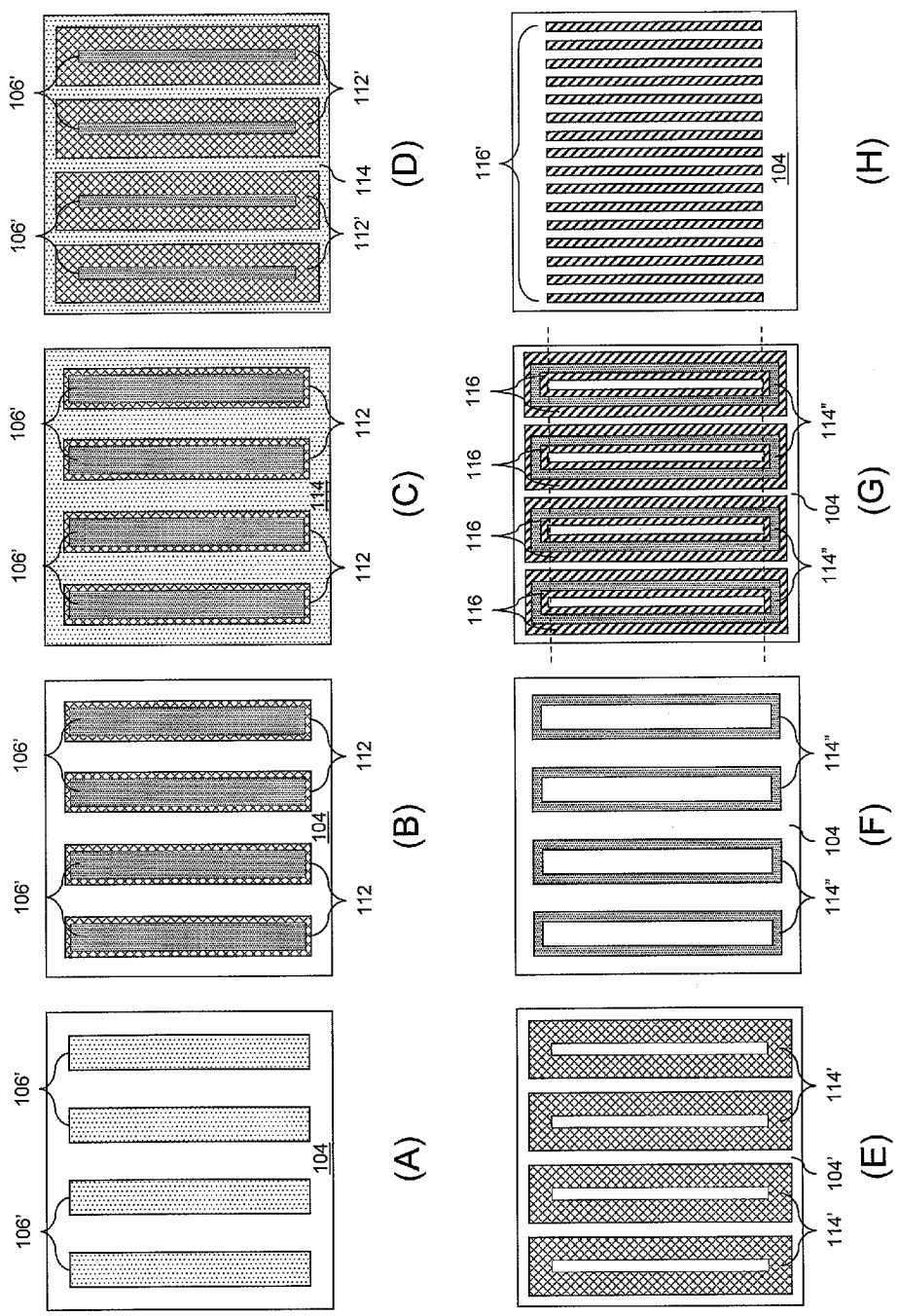

FIG. 3 is a top-down view of a further exemplary process flow for a self-aligned spacer multiple patterning method in accordance with the invention. This process flow is a further variation of the technique described with reference to FIG. 1, illustrating a triple patterning technique using a hybrid approach in which both photolithographic and film deposition techniques are used to form spacers. Except as otherwise stated, the description above with respect to FIG. 1 is also applicable to the process flow of FIG. 3.

FIG. 3A illustrates the substrate after formation of the first resist pattern 106'. The structure following alkaline surface treatment which results in modified first resist pattern surface 112 is shown in FIG. 3B, and after coating of the second photosensitive layer 114 is shown in FIG. 3C. FIG. 3D illustrates the substrate after softbake of the second photosensitive layer 114. The softbake causes the alkaline material to diffuse into a portion of both the first resist pattern and second photosensitive layer. The extent of diffusion can be controlled based on the softbake temperature and the diffusion coefficient of the alkaline material in the first resist pattern and second photosensitive layer. For example, if the same or similar material is used for both the first and second photosensitive layers, the extent of diffusion will be about the same in the first resist pattern and second photosensitive layer. The result of this diffusion is an enlarged alkaline region 112' in the first resist pattern and second photosensitive layer. The first resist pattern 106' and second photosensitive layer 114 are exposed and developed, leaving spacers 114' as shown in FIG. 3E. The spacers correspond to those portions of the first resist pattern 106' and second photosensitive layer 114 within the alkaline region 112'. In this exemplified process, those portions of the first resist pattern and second photosensitive layer not "poisoned" by the alkaline material are removed at the same time in the development step. This can be accomplished by using a post-exposure bake temperature after the exposure which is the same or greater than the characteristic post-exposure bake temperature of the first and second photosensitive layers. As described below, spacers 114' are used as a pattern or template on which to form additional spacers that are used for patterning of one or more underlying layers.

The spacers 114' can optionally be trimmed to reduce their width, resulting in trimmed spacers 114" as illustrated in FIG. 3F. Suitable trimming processes are known in the art. A spacer layer is deposited over the spacers 114", for example, by chemical vapor deposition such as plasma-enhanced CVD, low-pressure CVD or epitaxial growth, atomic layer deposition or sputtering. Of these, chemical vapor deposition is typical. Suitable materials for the spacer layer include, for example, silicon oxide, silicon nitride or silicon oxynitride. The thickness of the spacer layer will depend, for example, on the desired dimensions of the structures being formed and the degree of conformality of the spacer layer. A typical thickness for the spacer layer is from about 100 to 10001. Because the spacer layer is typically coated over the entire substrate surface, etching is conducted to remove the spacer layer material on horizontal surfaces of the substrate, leaving material as spacers 116 on sidewalls of the trimmed spacer patterns 114" as depicted in FIG. 3G. The sacrificial spacers 114" are removed, leaving behind only the sidewall spacers 116 to be used as a mask for etching one or more underlying layers. The trimmed sacrificial spacer patterns 114" are removed, for example, by oxygen plasma ASH. The resulting structure is trimmed, for example, along the dashed lines shown in FIG. 3G to separate the spacers 116 into discrete lines as shown in FIG. 3H. Etching of the one or more underlying layers can be conducted as described above with reference to the process flow of FIG. 1. Because there are two spacers for every line (i.e., one on each side surface) and two spacer processes are employed, the line density can effectively be quadrupled by double pitch-splitting.

EXAMPLES

Example 1

L1 Resist Polymer
(Poly(IAM/α-GBLMA/ODOTMA/HAMA))
Synthesis 10.51 grams (g) of 2-methyl-acrylic acid 1-isopropyl-adamantanyl ester (IAM), 6.82 g of 2-methyl-acrylic acid 2-oxo-tetrahydro-furan-3yl ester (α-GBLMA), 6.36 g of 2-methyl-acrylic acid 3-oxo-4,10-dioxa-tricyclo[5.2.1.0$^{2,6}$]dec-8-yl ester (ODOTMA) and 6.31 g of 2-methyl-acrylic acid 3-hydroxy-adamantanyl ester (HAMA) were dissolved in 27 g of tetrahydrofuran (THF). The mixture was degassed by bubbling with nitrogen for 20 minutes. A 500 ml flask equipped with a condenser, nitrogen inlet and mechanical stirrer was charged with 11 g of THF, and the solution was brought to a temperature of 67° C. 5.23 g of dimethyl-2,2-azodiisobutyrate (17 mol % based on total monomers) was dissolved in 5 g of THF and charged into the flask. The monomer solution was fed into a reactor at a rate of 16.0 milliliters per hour (mL/h) for 3 hours 30 minutes. The polymerization mixture was then stirred for an additional 30 minutes at 67° C. 5 g of THF was next added to the reactor and the polymerization mixture was cooled to room temperature. Precipitation was carried out in 1.0 L of isopropyl alcohol. After filtration, the polymer was dried, re-dissolved in 50 g of THF, re-precipitated into 1.1 L of isopropyl alcohol, filtered and dried in a vacuum oven at 45° C. for 48 hours, resulting in 25.4 g of the poly(IAM/α-GBLMA/ODOTMA/HAMA) polymer (Mw=7,934 and Mw/Mn=~1.46) shown below:

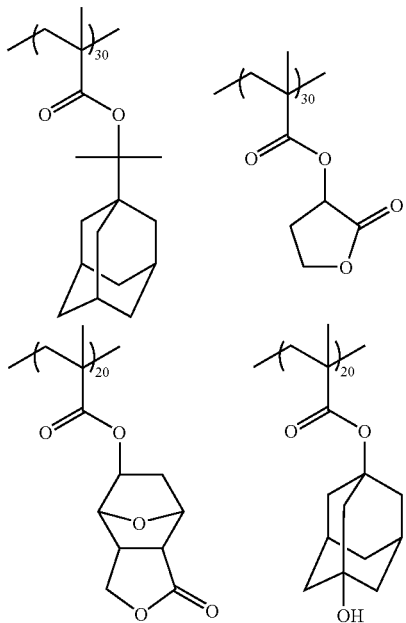

L1 Resist Formulation 3.169 g of the polymer formed as described above was dissolved in 96.38 g of a solvent mixture of 70 wt % propylene glycol monomethyl ether acetate (PGMEA) and 30 wt % cyclohexanone. To this mixture was added 0.405 g of triphenylsulfonium (adamantan-1yl methoxycarbonyl)-difluoromethanesulfonate, 0.041 g of 1-(tert-butoxycarbonyl)-4-hydroxypiperidine and 0.005 g of POLYFOX® PF-656 surfactant (Omnova Solutions Inc.). The resulting mixture was rolled on a roller for six hours and then filtered through a Teflon filter having a 0.2 micron pore size, thereby forming a positive-acting photoresist composition.

Surface Treatment Solution Formulation

A surface treatment solution was prepared by mixing 5 g of 1 wt % tris(2-aminoethyl)amine (TAEA) (Sigma-Aldrich) solution in deionized water, 1 g of 10 wt % of a surfactant solution (TERGITOL TMN-6, The Dow Chemical Company, Midland, Mich., USA), and 194 g of deionized water. This solution was filtered through a nylon filter having a 0.1 micron pore size.

First Lithography (L1) Patterning of Lines and Spaces

A 300 mm silicon wafer was spin-coated with AR™40A antireflectant (Rohm and Haas Electronic Materials LLC) to form a first bottom antireflective coating (BARC) on a TEL CLEAN TRACK™ LITHIUS™ i+ coater/developer. The wafer was baked for 60 seconds at 215° C., yielding a first BARC film thickness of 75 nm. A second BARC layer was next coated over the first BARC using AR™124 antireflectant (Rohm and Haas Electronic Materials), and was baked at 205° C. for 60 seconds to generate a 23 nm top BARC layer.

The L1 photoresist composition formed as described above was coated on top of the dual BARCs and soft-baked at 110° C. for 60 seconds, resulting in a resist film thickness of 750 Å. The first resist layer was coated with a topcoat layer (OC™2000 topcoat material, Rohm and Haas Electronic Materials) and exposed at various doses from 15 to 75 mJ/cm$^2$ through a reticle having various critical dimensions using an ASML TWINSCANT™ XT:1900i immersion scanner with a numerical aperture of 1.35 and dipole-35Y illumination (0.96 outer sigma/0.76 inner sigma) with X-polarization. The wafer was then post-exposure baked (PEB) at 100° C. for 60 seconds and developed for 12 seconds using Microposit™ MF CD-26 developer (Rohm and Haas Electronic Materials) to render first lithography (L1) patterns.

Curing and Surface Treatment

The wafer was hardbaked at 180° C. for 60 seconds. The wafer was next exposed to surface treatment chemistry in a sequential process by which the wafer was first rinsed with 2.38 wt % TMAH in water solution for 12 seconds using a TEL GP nozzle, and then rinsed with the surface treatment solution formulation described above on the TEL wafer track with wafer spin.

Second Lithography (L2)

EPIC™ 2098 positive photoresist (Rohm and Haas Electronic Materials) was coated over the surface-treated L1 patterns on the coater/developer at a spin speed that would provide a film thickness of 450 Å on a bare silicon wafer. The wafer was soft-baked at 120° C. for 60 seconds, and then coated with OC™ 2000 topcoat material (Rohm and Haas Electronic Materials). The second lithography (L2) was carried out using the same scanner settings as in the first lithographic process but using flood exposure with no mask at various exposure doses of from 12 to 34 mJ/cm$^2$. The wafer was then post-exposure baked (PEB) at 110° C. for 60 seconds and developed for 12 seconds using Microposit™ MF CD-26 developer (Rohm and Haas Electronic Materials). Spacer structures were thereby formed.

Examples 2-18

The procedures described above with respect to Example 1 are repeated except using the components set forth below in Table 1 in place of the TAEA and TERGITOL TMN-6 surfactant.

TABLE 1

| Example | Amine | Surfactant |
|---|---|---|
| 1 | A-1 | TERGITOL TMN-6 |
| 2 | A-2 | TERGITOL TMN-6 |
| 3 | A-3 | TERGITOL TMN-6 |
| 4 | A-4 | TERGITOL TMN-6 |
| 5 | A-5 | TERGITOL TMN-6 |
| 6 | A-6 | TERGITOL TMN-6 |
| 7 | A-7 | TERGITOL TMN-6 |
| 8 | A-8 | TERGITOL TMN-6 |
| 9 | A-9 | TERGITOL TMN-6 |
| 10 | A-1 | — |
| 11 | A-2 | — |
| 12 | A-3 | — |
| 13 | A-4 | — |
| 14 | A-5 | — |
| 15 | A-6 | — |
| 16 | A-7 | — |
| 17 | A-8 | — |
| 18 | A-9 | — |

It is expected that spacer structures would result after L2 development.

What is claimed is:

1. A self-aligned spacer multiple patterning method, comprising:
   (a) providing a semiconductor substrate comprising one or more layers to be patterned;
   (b) applying a first layer of a first photosensitive composition over the one or more layers to be patterned, wherein the first photosensitive composition comprises a first resin component and a first photoactive component;
   (c) exposing the first layer to activating radiation through a patterned photomask;
   (d) developing the exposed first layer to form a resist pattern;
   (e) heat treating the resist pattern in a hardbake process;
   (f) treating the hardbaked resist pattern with a material effective to make alkaline a surface of the resist pattern;
   (g) applying a second layer of a second photosensitive composition over the one or more layers to be patterned and in contact with the alkaline surface of the resist pattern, the second photosensitive composition comprising a second resin component and a photoacid generator;
   (h) exposing the second layer to activating radiation; and
   (i) developing the exposed second layer to form spacers over the one or more layers to be patterned, the spacers comprising portions of the second layer not removed during the second layer development.

2. The method of claim 1, wherein the step of exposing the second layer is a flood exposure.

3. The method of claim 1, wherein the steps of exposing and developing the second layer exposes and removes, respectively, the resist pattern.

4. The method of claim 1, further comprising removing the resist pattern after the steps of exposing and developing the second layer.

5. The method of claim 1, further comprising patterning one or more layer underlying the spacers using the spacers as a mask.

6. The method of claim 1, further comprising:
   (i) forming a spacer layer over sidewalls of the spacers, wherein the spacer layer is of a different material than the second layer; and
   (j) selectively removing the first spacers from the substrate, leaving second spacers formed from the spacer layer over the one or more layers to be patterned.

7. The method of claim 6, wherein the heat treating the resist pattern is conducted at a temperature of about 150° C. or higher.

8. The method of claim 1, wherein treating the resist pattern with the material effective to make alkaline a surface of the resist pattern comprises treating the resist pattern with an alkaline material and a surfactant.

9. The method of claim 1, wherein treating the resist pattern with the material effective to make alkaline a surface of the resist pattern comprises treating the resist pattern with a primary or secondary amine.

10. The method of claim 1, wherein the hardbaked first resist pattern is treated with the material effective to make alkaline a surface of the first resist pattern in a spin coating process.

11. The method of claim 1, wherein the material effective to make alkaline a surface of the resist pattern comprises an aqueous base developer.

12. The method of claim 11, wherein the aqueous base developer is a quaternary ammonium hydroxide solution.

13. The method of claim 10, wherein the quaternary ammonium hydroxide solution is a tetramethylammonium hydroxide solution.

14. The method of claim 1, wherein the second layer is positive-acting.

15. The method of claim 1, wherein steps (a) to (i) are conducted in sequence.

* * * * *